United States Patent [19]

Akita et al.

[11] 4,316,158
[45] Feb. 16, 1982

[54] R-C OSCILLATORS USING PLURAL INVERTERS

[75] Inventors: Sigeyuki Akita; Hiroaki Tanaka, both of Okazaki, Japan

[73] Assignee: Nippon Soken, Inc., Nishio, Japan

[21] Appl. No.: 109,916

[22] Filed: Jan. 7, 1980

[30] Foreign Application Priority Data

Jan. 17, 1979 [JP] Japan ............................. 54-4650

[51] Int. Cl.³ ..................... H03K 3/03; H03K 3/354
[52] U.S. Cl. ................................... 331/111; 331/57; 331/DIG. 3
[58] Field of Search .............. 331/108 C, 108 D, 111, 331/113 R, DIG. 3, 57

[56] References Cited

U.S. PATENT DOCUMENTS 3,851,277 11/1974 Suzuki et al. ............. 331/108 D X
3,863,179 1/1975 Goo ............................. 331/108 D

OTHER PUBLICATIONS

Electronic Design, vol. 23, Jun. 7, 1975, p. 90, "Inexpensive TTL Chip Makes a Verstile Oscillator Circuit".

*Primary Examiner*—Siegfried H. Grimm
*Attorney, Agent, or Firm*—Cushman, Darby & Cushman

[57] ABSTRACT

In an oscillator circuit including a variable capacitor for inverting a pair of inverters oppositely to each other with a time period defined by a resistance value of a resistor and a capacitance of the variable capacitor, an additional capacitor is provided to be biased by an inverter function of an additional inverter in voltage polarity opposite to that of the variable capacitor.

9 Claims, 6 Drawing Figures

R-C OSCILLATORS USING PLURAL INVERTERS

BACKGROUND OF THE INVENTION

The present invention relates to oscillator circuits suitable for being used as a signal generator, for instance a timer, a clock circuit, a sensor for detecting such various physical values as displacement or revolution of an object, and the like. The present invention is more particularly concerned with an improvement of an oscillator circuit in which a variable capacitor cooperates with a resistor to conduct oscillation in the oscillator circuit at a frequency proportional inversely to the product of a capacitance of the capacitor and a resistance value of the resistor.

To enhance the sensitivity of such a conventional oscillator as described above, it is required to expand a range of the oscillating frequency as wider as possible. For this requirement, however, a capacitor of a large capacitance must be utilized as the variable capacitor, and this results in an enlarged construction of the oscillator circuit due to the larger size of the capacitor, causing various undesirable problems in actual use of the oscillator circuit.

SUMMARY OF THE INVENTION

It is, therefore, the primary object of the present invention to provide an improved oscillator circuit in which an additional capacitor is provided to be biased in voltage polarity opposite to that of the variable capacitor so as to shorten the above-noted product and to provide a wider range of oscillating frequency of the oscillator circuit of this type in a compact construction.

According to the present invention there is provided an oscillator circuit which includes:

first and second inverters connected in series with each other and to an electric DC power source;

a resistor connected in series with the first inverter to form a closed circuit;

a capacitor connected at one end thereof with the output terminal of the second inverter and at the other end thereof with the output terminal of the first inverter through the resistor such that the first and second inverters are inverted opposite to each other with a time period defined by a resistance value of the resistor and a capacitance of the capacitor;

a third inverter connected to the electric DC power source and connected in series with the second inverter; and a capacitor connected at one end thereof with the output terminal of the third inverter and at the other end thereof with the output terminal of the second inverter through the first-named capacitor such that the second-named capacitor is biased by an inverter function of the third inverter in voltage polarity opposite to that of the first-named capacitor.

BRIEF DESCRIPTION OF THE DRAWINGS

Additional objects and advantages of the present invention will be more readily apparent from the following detailed description of preferred embodiments thereof when taken together with the accompanying drawings in which.

DESCRIPTION OF THE PREFERRED EMBODIMENTS

Figure 1:
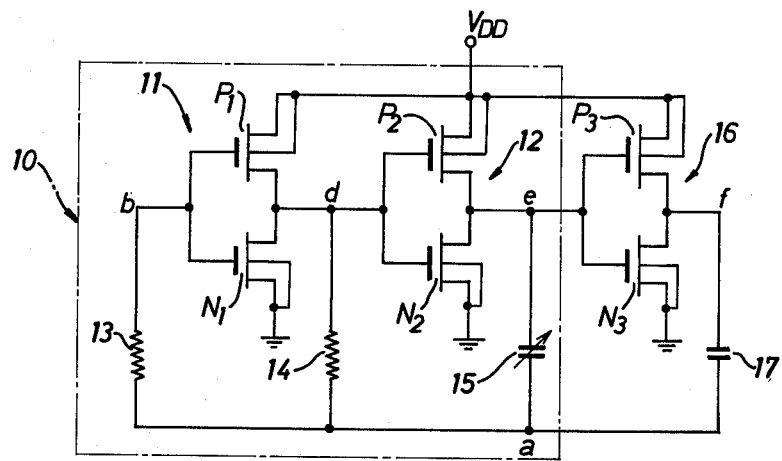
FIG. 1 is a circuit diagram of an oscillator circuit in accordance with the present invention.
Figure 2:
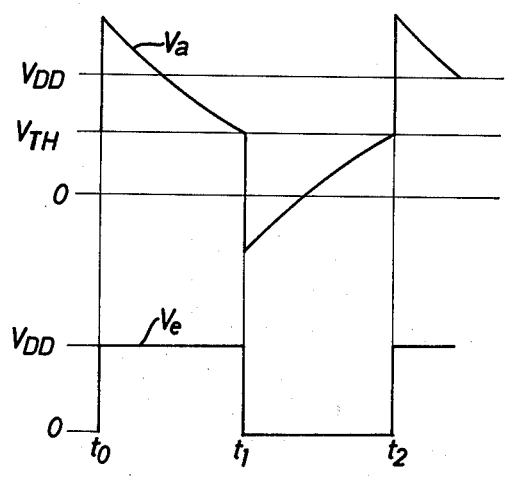
FIGS. 2 and 3 respectively depict waveforms obtained at various points in the oscillator circuit of FIG. 1.

Referring now to FIG. 1 of the drawings, there is illustrated a circuit diagram of an oscillator circuit in accordance with the present invention which includes a conventional oscillator 10. The conventional oscillator 10 comprises an inverter 11 which is formed by Complementary Metal Oxide Semiconductor or CMOS in the form of an integrated circuit. The inverter 11 includes a pair of field-effect transistors $P_1$ and $N_1$ respectively in the form of P-channel and N-channel types, each of the field-effect transistors being called as FET hereinafter. FET $P_1$ is provided with a source terminal for receiving a DC voltage $V_{DD}$ from an electric DC power source under actuation of switch means (not shown) and with a control gate connected to a control gate of FET $N_1$ as an input terminal b of inverter 11. FET $N_1$ is provided with a drain terminal grounded and with a source terminal connected to a drain terminal of FET $P_1$ as an output terminal d of inverter 11. In the embodiment, a threshold or transfer voltage of inverter 11 is determined as a predetermined voltage $V_{TH}$ between the DC voltage $V_{DD}$ and zero voltage, as shown in FIG. 2.

When an input voltage $V_b$ appearing at the input terminal b of inverter 11 is higher than the threshold voltage $V_{TH}$, FET $P_1$ is turned off, whereas FET $N_1$ is turned on to produce an output voltage $V_d$ with a low or zero level at its source or output terminal d. When the input voltage $V_b$ becomes lower than the threshold voltage $V_{TH}$, FET $N_1$ is turned off, whereas FET $P_1$ is turned on to render the low level output voltage $V_d$ a high level corresponding with the DC voltage $V_{DD}$. In other words, the inverter 11 produces the output voltage $V_d$ of low level in response to the input voltage $V_b$ of high level and inverts the same voltage $V_d$ into a high level voltage in response to the input voltage $V_b$ of low level.

The conventional oscillator 10 also comprises an inverter 12 which includes a pair of field-effect transistors $P_2$ and $N_2$ respectively in the form of P-channel and N-channel types. FET $P_2$ is provided with a source terminal for receiving the DC voltage $V_{DD}$ from the electric power source under actuation of the switch means and with a control gate connected as an input terminal of inverter 12 to the output terminal d of inverter 11. FET $N_2$ is provided with a drain terminal grounded and with a source terminal connected to a drain terminal of FET $P_2$ as an output terminal e of inverter 12, a control gate of FET $N_2$ being connected to the control gate of FET $P_2$. In the embodiment, a threshold or transfer voltage of inverter 12 is also determined as the predetermined voltage $V_{TH}$ described above. Other constructions of inverter 12 are the same as those of inverter 11.

When the output voltage $V_d$ from inverter 11 is higher than the threshold voltage $V_{TH}$, FET $P_2$ is turned off, whereas FET $N_2$ is turned on to produce an output voltage $V_e$ with a low or zero level at its source or output terminal e. When the output voltage $V_d$ becomes lower than the threshold voltage $V_{TH}$, FET $N_2$ is turned off, whereas FET $P_2$ is turned on to render the low level output voltage $V_e$ a high level corresponding with the DC voltage $V_{DD}$. In other words, the inverter 12 produces the output voltage $V_e$ of low level in response to the output voltage $V_d$ of high level and inverts the same voltage $V_e$ into a high level voltage in response to the output voltage $V_d$ of low level.

Between the input and output terminals b and d of inverter 11, resistors 13 and 14 are connected in series to each other. The resistor 13 serves to limit an electric current through the inverter 11 to a safe level. A variable capacitor 15 is provided with one terminal a connected through the resistor 14 to the output terminal d of inverter 11 and with the other terminal connected directly to the output terminal e of inverter 12. In the embodiment, a resistance of resistor 14 is determined as a value R, and a variable capacitance of capacitor 15 is indicated as the character $C_V$. The resistance value R and variable capacitance $C_V$ act a main role for determining an oscillating frequency of oscillator 10.

Hereinafter, construction regarding a main portion of the present invention will be described in detail with reference to FIG. 1. In this figure, an inverter 16 is connected at its input terminal to the output terminal e of inverter 12 and also connected at its output terminal f to the terminal a of variable capacitor 15 through a capacitor 17 of a fixed capacitance $C_f$. The inverter 16 includes a pair of field-effect transistors $P_3$ and $N_3$ which are respectively in the form of P-channel and N-channel types. FET $P_3$ is provided with a source terminal for receiving the DC voltage $V_{DD}$ from the electric power source under actuation of the above-noted switch means and with a control gate connected to the output terminal e of inverter 12 as the input terminal of inverter 16. FET $N_3$ is provided with a drain terminal grounded and with a source terminal connected to a drain terminal of FET $P_3$ as the output terminal of inverter 16, a control gate of FET $N_3$ being connected to the control gate of FET $P_3$. In the embodiment, a threshold or transfer voltage of inverter 16 is determined as the predetermined voltage $V_{TH}$ described above. Other constructions of inverter 16 are the same as those of each of inverters 11 and 12.

When the output voltage $V_e$ from inverter 12 is higher than the threshold voltage $V_{TH}$, FET $P_3$ is turned off, whereas FET $N_3$ is turned on to produce an output voltage $V_f$ with a low or zero level at its source or output terminal f. When the output voltage $V_e$ becomes lower than the threshold voltage $V_{TH}$, FET $N_3$ is turned off, whereas FET $P_3$ is turned on to render the low level output voltage $V_f$ a high level corresponding with the DC voltage $V_{DD}$. In other words, the inverter 16 produces the output voltage $V_f$ of low level in response to the output voltage $V_e$ of high level and inverts the same voltage $V_f$ into a high level voltage in response to the output voltage $V_e$ of low level. From the above description, it should be recognized that the output voltage $V_f$ is different in level from the output voltage $V_e$ due to function of the inverter 16 to render respective polarity of capacitors 15 and 17 opposite to each other.

Prior to description regarding operation of the above embodiment, operation of the conventional oscillator 10 without the inverter 16 and capacitor 17 will be described below with reference to waveforms shown in FIG. 2. Assuming that at time $t=t_0$, an output voltage $V_e$ from inverter 12 is at a high level due to an output voltage $V_d$ of low level from inverter 11, a voltage $V_a$ appearing at the terminal a of capacitor 15 becomes a total of the DC and threshold voltages $V_{DD}$ and $V_{TH}$. Then, an electric current flows through a first closed circuit formed by the capacitor 15, resistor 14, N-channel of FET $N_1$, DC power source and P-channel of FET $P_2$ and, in turn, the voltage $V_a$ gradually lowers with a time constant defined by the resistance value R of resistor 14 and the variable capacitance $C_V$ of capacitor 15. At this stage, the output voltage $V_e$ from inverter 12 is maintained at the high level.

When the voltage $V_a$ of capacitor 15 lowers and reaches the threshold voltage $V_{TH}$ with lapse of time from $t_0$ to $t_1$, the inverter 11 is inverted to render the low level output voltage $V_d$ a high level, and simultaneously the inverter 12 is inverted to render the high level output voltage $V_e$ a low level. These inverter functions change the voltage $V_a$ of capacitor 15 from the threshold voltage $V_{TH}$ into a negative voltage $-V_{TH}$. Subsequently, an electric current flows through a second closed circuit formed by the DC power source, P-channel of FET $P_1$, resistor 14, capacitor 15 and N-channel of FET $N_2$ and, in turn, the voltage $V_a$ of capacitor 15 gradually rises with the previous time constant defined by the resistance value R and the variable capacitance $C_V$. At this stage, the output voltage $V_e$ from inverter 12 is maintained at the low level.

When the voltage $V_a$ of capacitor 15 rises and reaches the threshold voltage $V_{TH}$ with lapse of time from $t_1$ to $t_2$, the inverter 11 is again inverted to render the high level output voltage $V_d$ a low level, and simultaneously the inverter 12 is inverted to render the low level output voltage $V_e$ a high level. These inverter functions change the voltage $V_a$ of capacitor 15 from the threshold voltage $V_{TH}$ into a total of the threshold and DC voltages $V_{TH}$ and $V_{DD}$ at time $t=t_2$. Thereafter, the above-noted operation is repeated to conduct oscillation in the conventional oscillator 10 with a time period ($t_2-t_0$). In this instance, the time period ($t_2-t_0$) may be arranged in accordance with variation of the capacitance $C_V$ of capacitor 15.

Figure 3:
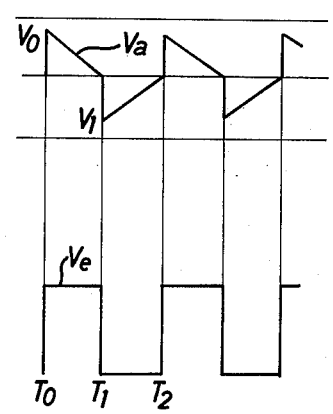

Operation of the above embodiment will be now described below in detail in relation to operation of the conventional oscillator 10 with reference to FIG. 3.

(1) In case the capacitance $C_V$ of variable capacitor 15 is arranged to be larger than the capacitance $C_f$ of fixed capacitor 17:

Assuming that an output voltage $V_e$ from inverter 12 is at a high level at time $t=t_0$ to render an output voltage $V_f$ from inverter 16 a low level, the variable capacitor 15 is biased in voltage polarity opposite to that of the fixed capacitor 17 due to a difference in level between the output voltages $V_e$ and $V_f$. Then, a voltage $V_a$ appearing at the terminal a of capacitor 15 is partly offset by a terminal voltage appearing across the capacitor 17 and becomes a voltage $V_0$ lower than a total of the DC and threshold voltages $V_{DD}$ and $V_{TH}$ described above. Subsequently, an electric current flows partly through the above-noted first closed circuit, and the remaining electric current flows through a third closed circuit formed by the capacitors 15 and 17, N-channel of FET $N_3$, DC power source and P-channel of FET $P_2$ and, in turn, the voltage $V_a$ of capacitor 15 lowers gradually from the voltage $V_0$ with lapse of time. At this stage, the output voltage e from inverter 12 is maintained at the high level.

When the voltage $V_a$ of capacitor 15 lowers and reaches the threshold voltage $V_{TH}$ with lapse of time from $T_0$ to $T_1$, the inverter 11 is inverted to render an output voltage $V_d$ a high level, and simultaneously the inverter 12 is inverted to render the high level output voltage $V_e$ a low level so that the low level output voltage $V_f$ from inverter 16 becomes a high level. Then, the voltage $V_a$ of capacitor 15 is partly offset by a terminal voltage across the capacitor 17 and changed from the threshold voltage $V_{TH}$ into a voltage $V_1$ higher than the negative voltage $-V_{TH}$. Subsequently, an electric current flows partly through the above-noted second closed circuit and the remaining electric current flows through a fourth closed circuit formed by the DC power source, P-channel of FET $P_3$, capacitors 17 and 15 and N-channel of FET $N_2$ and, in turn, the voltage $V_a$ of capacitor 15 rises gradually from the voltage $V_1$ with lapse of time. At this stage, the output voltage e of inverter 12 is maintained at the low level.

When the voltage $V_a$ of capacitor 15 rises and reaches the threshold voltage $V_{TH}$ with lapse of time from $T_1$ to $T_2$, the inverter 11 is again inverted to render the high level output voltage $V_d$ a low level, and simultaneously the inverter 12 is inverted to render the low level output voltage $V_e$ a high level so that the high level output voltage $V_f$ from inverter 16 becomes a low level. These inverter functions change the voltage $V_a$ from the threshold voltage $V_{TH}$ into the voltage $V_0$, as previously described. Thereafter, the above-noted operation is repeated to conduct oscillation in the oscillator circuit in accordance with the present invention with a time period ($T_2-T_0$).

From the above description, it will be understood that in case the capacitance $C_V$ of capacitor 15 is larger than the capacitance $C_f$ of capacitor 17, the time period ($T_2-T_0$) in oscillation of the oscillator circuit according to the present invention is shorter than the time period ($t_2-t_0$) in oscillation of the conventional oscillator 10. As a result, an oscillating frequency of the oscillator circuit becomes higher than that of the conventional oscillator 10. In addition, in case the capacitance $C_V$ is very larger than the capacitance $C_f$, oscillating characteristics of the oscillator circuit approach to those of the conventional oscillator 10.

(2) In case the capacitance $C_V$ of variable capacitor 15 is smaller than the capacitance $C_f$ of fixed capacitor 17:

Assuming that an output voltage $V_f$ from inverter 16 is at a low level due to output voltages $V_d$ and $V_e$ of low and high levels from inverters 11 and 12, the capacitor 15 is biased in voltage polarity opposite to that of the capacitor 17 due to a difference in level between the output voltages $V_e$ and $V_f$. Then, a voltage $V_a$ appearing at the terminal a of capacitor 15 is fully offset by a terminal voltage appearing across the capacitor 17 and becomes about zero volts. This inverts each function of inverters 11, 12 and 16 with time delay defined by inherent propagation-time-delay characteristics of each of inverters 11, 12 and 16. Then, these inverter functions serve to bias the capacitors 15 and 17 in voltage polarity opposite to each other so that the voltage $V_a$ of capacitor 15 is offset by a terminal voltage across the capacitor 17 to substantially become the DC voltage $V_{DD}$. Thereafter, the inverters 11, 12 and 16 are respectively inverted, as previously described.

From the above description, it will be understood that in case the capacitance $C_V$ of variable capacitor 15 is smaller than the capacitance $C_f$ of capacitor 17, the oscillator circuit according to the present invention oscillates at a very high frequency corresponding with a short time period defined by the inherent propagation-time-delay characteristics of each of inverters 11, 12 and 16, substantially as the same as ringing oscillation of a conventional ring oscillator.

Figure 4:
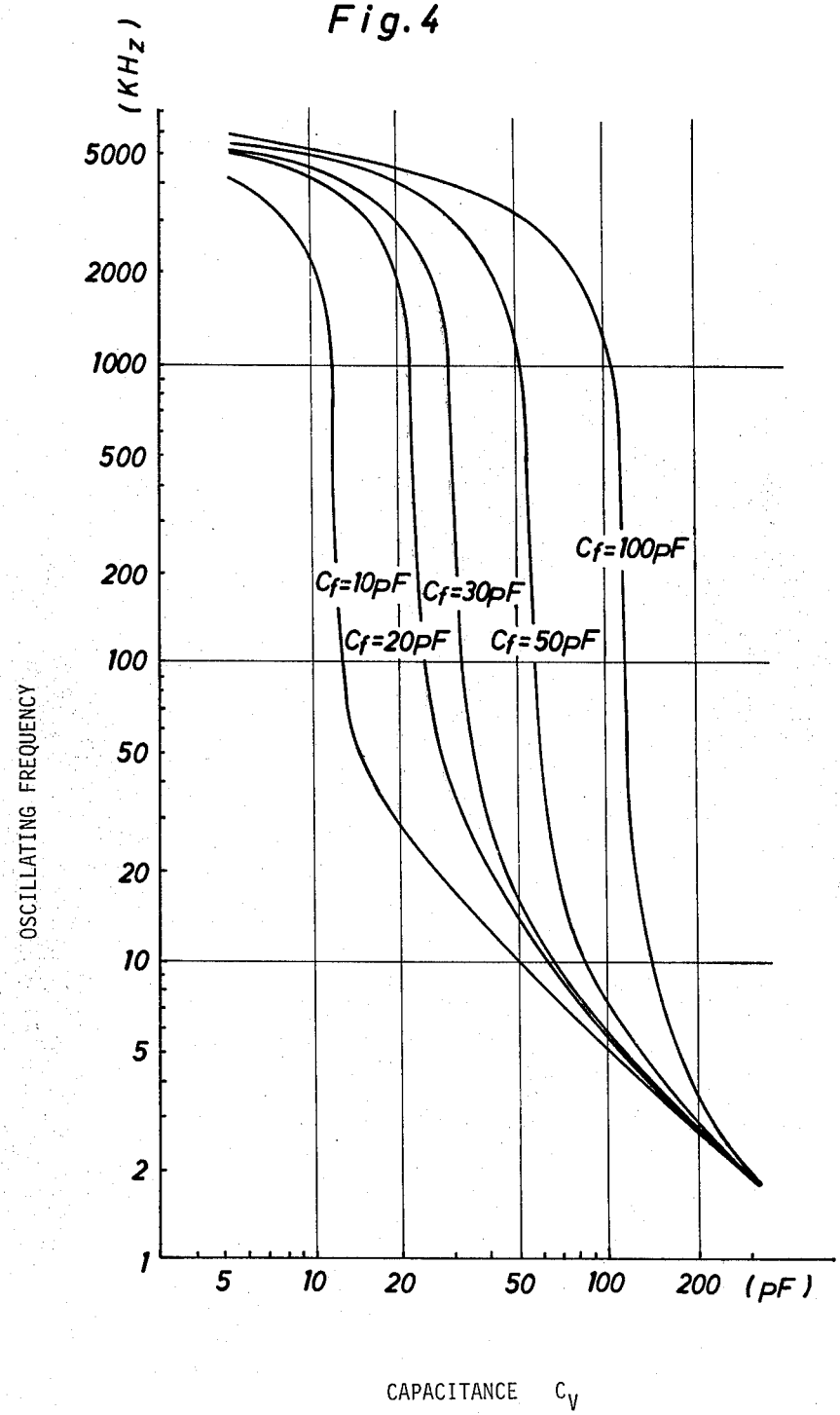
FIG. 4 is a graph illustrating characteristic curves of oscillating frequency in the oscillator circuit of FIG. 1.

As a result of experimentation of the embodiment, the inventors have obtained characteristic curves indicative of relationship between an oscillating frequency in the oscillator circuit and the variable capacitance $C_V$ in consideration with change of the fixed capacitance $C_f$, as shown in FIG. 4. From these characteristic curves, it will be easily understood that a range of the oscillating frequency in the oscillator circuit becomes very wider in comparison with the rate of change of the variable capacitance $C_V$. In the experimentation, resistance values of resistors 13 and 14 are determined zero ohms and 820 kiloohms respectively, and the DC voltage $V_{DD}$ of the electric power source is determined six volts. Furthermore, an inverter of TC4069UBP manufactured by Tokyo Shibaura Denki Kabushiki Kaisha in Japan is used as each of the inverters 11, 12 and 16.

Although in the above embodiment only the capacitor 15 is adapted as a variable capacitor, the capacitor 17 may be adapted as a variable one in replacement of the capacitor 15. Furthermore, each of capacitors 15 and 17 may be adapted as a variable capacitor.

Figure 5:
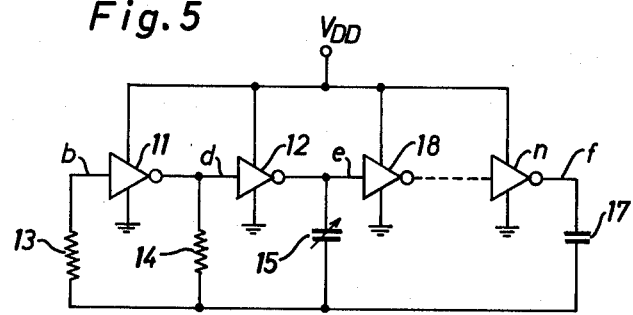
FIGS. 5 and 6 respectively illustrate modifications of the oscillator circuit in FIG. 1.

While in the above embodiment the single inverter 16 is connected between the capacitors 15 and 17, it may be replaced with an odd number of inverters 18 to n which are connected in series to each other, as shown in FIG. 5, to ensure the same operational effect as that of the above embodiment.

Figure 6:
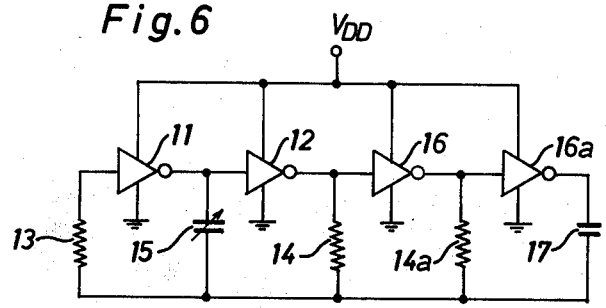

FIG. 6 illustrates a modification of the above embodiment in which the inverter 11 is connected in series with the resistor 13 and the variable capacitor 15 to form a closed circuit. A series circuit of the inverter 12 and the resistor 14 is connected in parallel with the variable capacitor 15, and a series circuit of the inverter 16 and a resistor 14a is also connected in parallel with the resistor 14. Furthermore, an inverter 16a is connected in series with the resistor 14a and the fixed capacitor 17 to form another closed circuit. When the DC voltage $V_{DD}$ from the electric power source is applied to all the inverters in the modification, the inverters 11 and 16a produce different output voltages in level from each other, as similar to the previous embodiment. Thus, the capacitor 17 is biased in voltage polarity opposite to that of the capacitor 15 due to the difference in level between the output voltages from inverters 11 and 16a to ensure substantially the same operational effect as that of the previous embodiment.

Having now fully set forth both structure and operation of preferred embodiments of the concept underlying the present invention, various other embodiments as well as certain variations and modifications of the embodiments herein shown and described will obviously occur to those skilled in the art upon becoming familiar with said underlying concept. It is to be understood, therefore, that within the scope of the appended claims, the invention may be practiced otherwise than as specifically set forth herein.

What is claimed is:
1. In an oscillator circuit including:
a first inverter connected to an electric DC power source;
a second inverter connected to said electric DC power source and having an input terminal connected to an output terminal of said first inverter;

a resistor connected in series with said first inverter to form a closed circuit; and a capacitor connected at one end thereof with an output terminal of said second inverter and at the other end thereof with the output terminal of said first inverter through said resistor such that said first and second inverters are inverted opposite to each other with a time period defined by a resistance value of said resistor and a capacitance of said capacitor;

the improvement comprising:

a third inverter connected to said electric DC power source and connected at its input terminal to the output terminal of said second inverter; and a capacitor connected at one end thereof with an output terminal of said third inverter and at the other end thereof with the output terminal of said second inverter through said first-named capacitor such that said second-named capacitor is biased by an inverter function of said third inverter in voltage polarity opposite to that of said first-named capacitor.

2. An oscillator circuit as claimed in claim 1, wherein one of said first and second-named capacitors is a variable capacitor.

3. An oscillator circuit as claimed in claim 1, wherein each of said first and second-named capacitors is a variable capacitor.

4. An oscillator circuit as claimed in claim 1, 2 or 3, wherein said third inverter comprises an odd number of inverters connected in series with each other.

5. An oscillator circuit as claimed in claim 1, wherein each of said first, second and third inverters comprises a pair of field-effect transistors of CMOS type.

6. An oscillator circuit comprising:

a first inverter connected to an electric DC power source;

a second inverter connected to said electric DC power source and having an input terminal connected to an output terminal of said first inverter;

a first capacitor connected in series with said first inverter to form a closed circuit;

a resistor connected at one end thereof with an output terminal of said second inverter and at the other end thereof with the output terminal of said first inverter through said first capacitor such that said first and second inverters are inverted oppositely to each other with a time period defined by a capacitance of said first capacitor and a resistance value of said resistor;

a third inverter connected to said electric DC power source and having an input terminal connected to the output terminal of said second inverter;

a fourth inverter connected to said electric DC power source and having an input terminal connected to an output terminal of said third inverter; and a second capacitor connected at one end thereof with an output terminal of said fourth inverter and at the other end thereof with the output terminal of said second inverter through said resistor such that said second capacitor is biased by each inverter function of said third and fourth inverters in voltage polarity opposite to that of said first capacitor.

7. An oscillator circuit as claimed in claim 6, wherein one of said first and second capacitors is a variable capacitor.

8. An oscillator circuit as claimed in claim 6, wherein each of said first and second capacitors is a variable capacitor.

9. An oscillator circuit as claimed in claim 6, wherein each of said first, second, third and fourth inverters comprises a pair of field-effect transistors of CMOS type.

* * * * *